(12) United States Patent
Hou et al.

(10) Patent No.: US 9,129,076 B2
(45) Date of Patent: Sep. 8, 2015

(54) HIERARCHICAL WAFER YIELD PREDICTION METHOD AND HIERARCHICAL LIFETIME PREDICTION METHOD

(71) Applicant: UNITED MICROELECTRONICS CORP., Hsin-Chu (TW)

(72) Inventors: Hsin-Ming Hou, Tainan (TW); Ji-Fu Kung, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/099,997

(22) Filed: Dec. 8, 2013

(65) Prior Publication Data

US 2014/0089871 A1    Mar. 27, 2014

Related U.S. Application Data

(63) Continuation-in-part of application No. 13/225,495, filed on Sep. 5, 2011, now abandoned.

(51) Int. Cl.
*G06F 17/50* (2006.01)
*H01L 21/66* (2006.01)

(52) U.S. Cl.
CPC ............... *G06F 17/50* (2013.01); *H01L 22/14* (2013.01); *H01L 22/20* (2013.01)

(58) Field of Classification Search
CPC . G06F 17/5045; G06F 17/5081; G06F 11/08; G06F 2217/12; G01R 31/26; H03K 19/17764; B01J 2219/00427; G03F 9/7076; G03F 9/7084; G03F 1/144; G03F 1/36; B82Y 30/00
USPC .......................................... 716/56, 112, 136
See application file for complete search history.

(56) References Cited

U.S. PATENT DOCUMENTS

| | | | |
|---|---|---|---|
| 3,751,647 A | 8/1973 | Maeder | |
| 5,773,315 A | 6/1998 | Jarvis | |
| 5,777,901 A | 7/1998 | Berezin | |
| 6,044,208 A | 3/2000 | Papadopoulou | |
| 6,338,001 B1 | 1/2002 | Steffan | |
| 6,393,602 B1 * | 5/2002 | Atchison et al. | 716/56 |
| 6,449,749 B1 * | 9/2002 | Stine | 716/56 |
| 6,496,958 B1 | 12/2002 | Ott | |
| 6,795,952 B1 | 9/2004 | Stine | |
| 6,834,375 B1 | 12/2004 | Stine | |
| 7,174,521 B2 | 2/2007 | Stine | |
| 7,689,948 B1 | 3/2010 | White | |
| 7,707,526 B2 | 4/2010 | Su | |
| 7,962,864 B2 | 6/2011 | Nehmadi | |
| 2008/0140330 A1 * | 6/2008 | Morioka et al. | 702/81 |
| 2008/0282210 A1 | 11/2008 | Stine | |
| 2009/0228129 A1 | 9/2009 | Moyne | |

OTHER PUBLICATIONS

Leachman, Yield Modeling, Feb. 10, 2011, IEOR130, Methods of Manufacturing Improvement, pp. 1-11.*

* cited by examiner

*Primary Examiner* — Nghia Doan
(74) *Attorney, Agent, or Firm* — Winston Hsu; Scott Margo

(57) ABSTRACT

For improving wafer fabrication, yield and lifetime of wafers are predicted by determining coefficients of a yield domain for wafer yield prediction and a lifetime domain for a wafer lifetime prediction, an integral domain, an electric/layout domain, a metrology/defect domain, and a machine sensor domain in a hierarchical manner. With the aid of the hierarchically-determined coefficients, noises in prediction can be reduced so that precision of prediction results of the yields or the lifetimes of wafers can be raised.

11 Claims, 5 Drawing Sheets ated with the present invention disclosed a hierarchical wafer yield prediction method and hierarchical lifetime prediction method.

HIERARCHICAL WAFER YIELD PREDICTION METHOD AND HIERARCHICAL LIFETIME PREDICTION METHOD

CROSS REFERENCE TO RELATED APPLICATIONS

This is a continuation-in-part application of U.S. patent application Ser. No. 13/225,495 filed on Sep. 5, 2011.

BACKGROUND OF THE INVENTION

1. Field of the Invention

The present invention relates to a hierarchical wafer yield prediction method and a hierarchical lifetime prediction method, and more particularly, to a hierarchical wafer yield prediction method and a hierarchical lifetime prediction method both using a yield/lifetime domain, an integral domain, an electric/layout domain, a metrology/defect domain, and a machine sensor domain as different levels for prediction.

2. Description of the Prior Art

In conventional wafer fabrication, yield of fabricated wafers is highly monitored for improvements. Moreover, the yield may be predicted by observing data generated by fault detection and classification machine sensors which are responsible for detecting defects of the fabricated wafers.

However, there are several intermediate processes in wafer fabrication, and these intermediate processes may introduce large scales of noises in yield prediction. If these intermediate processes are highly correlative, or if these intermediate processes are performed as flat algorithms, the noises in the yield prediction will get worse.

SUMMARY OF THE INVENTION

An embodiment of the present invention discloses a hierarchical wafer yield prediction method. The method comprises generating an overall die yield of a plurality of wafers, determining a random yield according to a maximum die yield of a wafer and a total number of dies fabricated on the wafer, generating a systematic yield by dividing the overall die yield by the random yield, determining at least one systematic integral value according to the systematic yield, determining at least one systematic fault detection and classification value according to the at least one systematic integral value, determining a random defect density integral value according to the random yield, and determining a random fault detection and classification value according to the random defect density integral value.

Another embodiment of the present invention discloses a hierarchical wafer lifetime prediction method. The method comprises generating an overall die lifetime of at least one wafer, determining an extrinsic lifetime according to a maximum lifetime and a total number of dies fabricated on the wafer, determining an intrinsic lifetime by dividing overall die lifetime by the extrinsic lifetime, determining at least one extrinsic integral value according to the extrinsic lifetime, determining at least one extrinsic fault detection and classification value according to the at least one extrinsic integral value, determining an intrinsic integral value according to the intrinsic lifetime, and determining an intrinsic fault detection and classification value according to the intrinsic integral value.

Another embodiment of the present invention discloses a hierarchical wafer yield prediction method. The method comprises generating an overall die yield of a plurality of wafers, determining a systematic yield according to the overall die yield of the plurality of wafers, an overall defect density of the plurality of wafers and a die area, generating a random yield by dividing the overall die yield by the systematic yield, determining at least one systematic integral value according to the systematic yield, determining at least one systematic fault detection and classification value according to the at least one systematic integral value, determining a random defect density integral value according to the random yield, and determining a random fault detection and classification value according to the random defect density integral value.

Another embodiment of the present invention discloses a hierarchical wafer lifetime prediction method. The method comprises generating an overall die lifetime of at least one wafer, determining an intrinsic lifetime according to the overall die lifetime of the at least one wafer, an overall defect density of the at least one wafer and a die area, determining an extrinsic lifetime by dividing the overall die lifetime by the intrinsic lifetime, determining at least one extrinsic integral value according to the extrinsic lifetime, determining at least one extrinsic fault detection and classification value according to the at least one extrinsic integral value, determining an intrinsic integral value according to the intrinsic lifetime, and determining an intrinsic fault detection and classification value according to the intrinsic integral value.

These and other objectives of the present invention will no doubt become obvious to those of ordinary skill in the art after reading the following detailed description of the preferred embodiment that is illustrated in the various figures and drawings.

DETAILED DESCRIPTION

For raising precision in the wafer yield prediction, the present invention discloses a hierarchical wafer yield prediction method. The hierarchical wafer yield prediction method utilizes five levels for discarding noises including a yield domain for wafer yield prediction or lifetime domain for wafer lifetime prediction, an integral domain, an electric/layout domain, a metrology/defect domain, and a machine sensor domain. The present invention further discloses a permutation of the hierarchical wafer yield prediction method to perform a wafer lifetime prediction.

Figure 1:
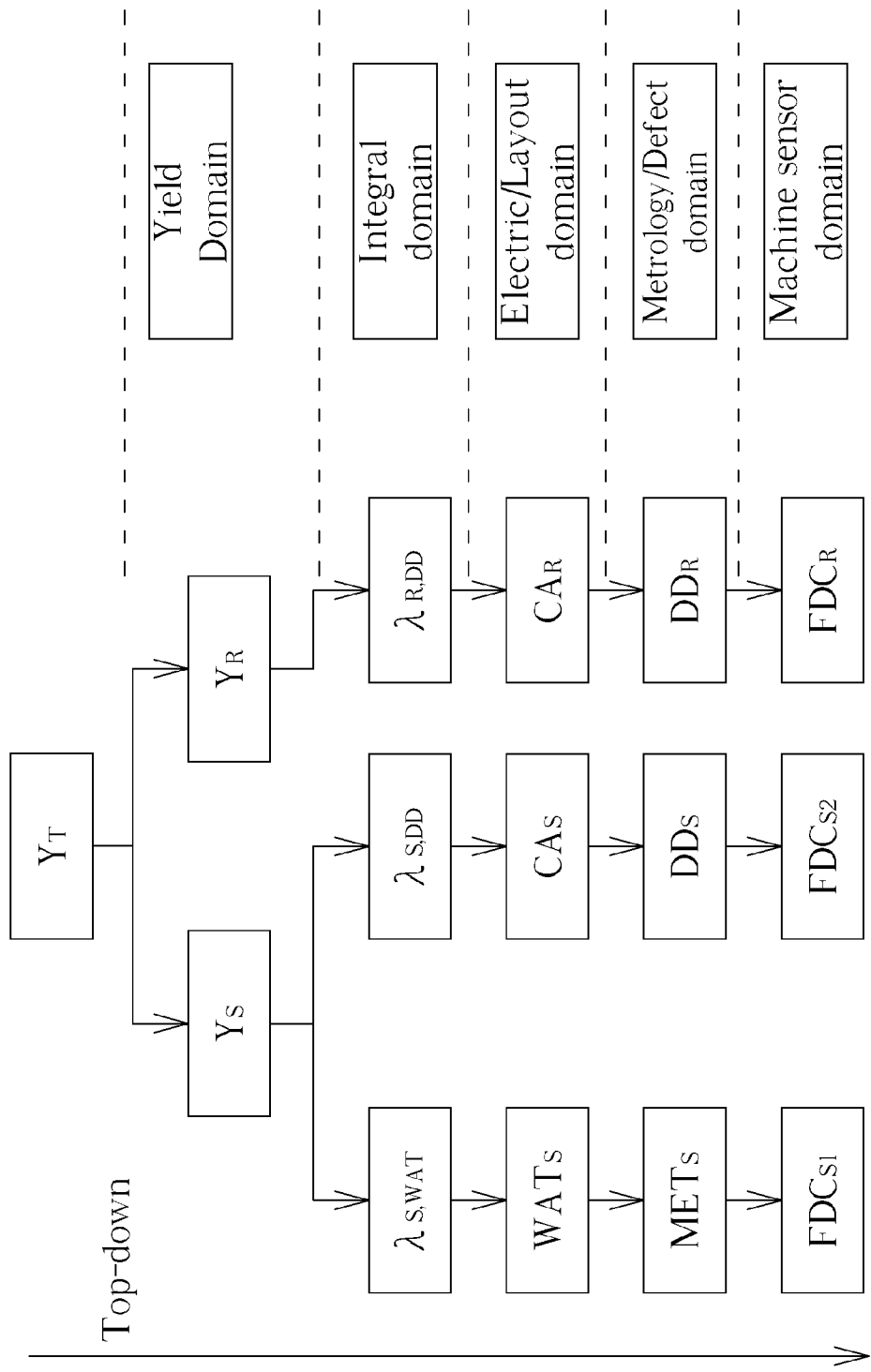
FIG. 1 illustrates a hierarchy utilized in a hierarchical wafer yield prediction method.

Please refer to FIG. 1, which illustrates a hierarchy utilized in a hierarchical wafer yield prediction method according to a first embodiment of the present invention.

(a) Yield Domain

As shown in FIG. 1, an overall die yield $Y_T$ of fabricated wafers is first measured. The overall die yield of a plurality of wafers is represented by the following equation:

$$Y_T = Y_R Y_s \qquad (1);$$

Where $Y_S$ is a systematic yield $Y_S$, $Y_R$ is a random yield $Y_R$ and $Y_T$ is the overall die yield $Y_T$ of a plurality of wafers.

When the number of wafers to be analyzed is greater than five, the systematic yield $Y_S$ is determined by dividing the overall die yield $Y_T$ by the random yield $Y_R$. To determine the random yield $Y_R$, the distance between a peak of the histogram and a maximum die yield identified on a wafer map is determined. It is expected to be approximately three standard deviations (3σ) of a normal distribution resulting from the random yield $Y_R$. For a binomial model with the random yield $Y_R$ as a distribution mean, the standard deviation (σ) of the random yield $Y_R$ is given by $\sqrt{Y_R(1-Y_R)/GD}$. The random yield $Y_R$ is determined according to the following equation:

$$MY - Y_R = 3\sqrt{Y_R(1-Y_R)/GD} \qquad (2);$$

where MY denotes an achieved maximum die yield and GD denotes the total number of dies printed on the wafer, i.e., the gross die. Equation (2) is used to find the random yield $Y_R$.

Most noises are not collected since they fall outside of the three standard deviations from the distribution mean, and most of the noises are discarded as a result.

When the number of wafers to be analyzed is less than or equal to five, the random yield $Y_R$ is determined by dividing the overall die yield $Y_T$ by the systematic yield $Y_S$. Linear regression is performed to determine the best fit value for the systematic yield $Y_S$ according to the overall die yield $Y_T$, an overall defect density $D_O$ and a die area A. Data points for linear regression are determined by having a scalar dependent variable being the overall die yield $Y_T$ and an explanatory variable being the die area A multiplied by the number of dice grouped together, i.e., groups of 2, 3, 4, 5, etc. The linear regression equation is as follows:

$$\ln Y_T = \ln Y_S - A D_O \qquad (3);$$

Note that both the systematic yield $Y_S$ and the random yield $Y_R$ are assumed to belong to a yield domain, as shown in FIG. 1.

(b) Integral Domain

A systematic wafer acceptance test integral $\lambda_{S,WAT}$, a systematic defect density integral $\lambda_{S,DD}$ and a random defect density integral $\lambda_{R,DD}$ are mean number of defects per die according to the respective wafer yield.

The systematic wafer acceptance test integral $\lambda_{S,WAT}$ and the systematic defect density integral $\lambda_{S,DD}$ can be calculated by integrating the systematic yield $Y_S$ throughout the wafer. And the random defect density integral $\lambda_{R,DD}$ can be calculated by integrating the random yield $Y_R$ throughout the wafer.

The systematic wafer acceptance test integral $\lambda_{S,WAT}$, the systematic defect density integral $\lambda_{S,DD}$, and the random defect density integral $\lambda_{R,DD}$ are assumed to belong to an integral domain, as shown in FIG. 1.

(c) Electric/Layout Domain, Metrology/Defect Domain, and Machine Sensor Domain

The electric/layout domain analysis, the metrology/defect domain analysis, and the machine sensor domain analysis are using a principal component analysis or a partial least square analysis.

The principal component analysis is a way of identifying patterns in data, and expressing the data in such a way as to highlight their similarities and differences. Since patterns in data can be hard to find in data of high dimension, where the luxury of graphical representation is not available, principal component analysis is a powerful tool for analyzing data. Therefore, with the aid of the principal component analysis, dominant causes of wafer defects will be determined. A method of principal component analysis comprises getting some data; subtracting a mean from each of a data dimension; calculating a covariance matrix; calculating an eigenvectors and eigenvalues of the covariance matrix; choosing components and forming a feature vector; and deriving the new data set.

The partial least square analysis is used for determining correlations between factors. The partial least square analysis comprises of regression and classification tasks as well as dimension reduction techniques and modeling tools. Underlying assumption of method of the partial least square analysis is that an observed data is generated by a system or process which is driven by a small number of latent (not directly observed or measured) variables. Therefore, with the aid of the partial least square analysis, correlations between causes of wafer defects will be determined. The main purpose of PLS is to build a linear model:

$$Y = XB + E \qquad (4)$$

where Y is an n cases by m variables response matrix, X is an n cases by p variables predictor matrix, B is a p by m regression coefficient matrix, and E is a noise term for the model which has the same dimensions as Y. Usually, the variables in X and Y are centered by subtracting their means and scaled by dividing by their standard deviations.

Note that plurality of data from the electric/layout domain uses the plurality of data from the integral domain, the metrology/defect domain uses the plurality of data from the electric/layout domain, and the machine sensor domain uses the plurality of data from the metrology/defect domain to perform data analysis using the principal component analysis or the partial least square analysis under specified domain.

(c-1) Systematic Wafer Acceptance Test Integral $\lambda_{S,WAT}$

The systematic wafer acceptance test integral $\lambda_{S,WAT}$ is processed by a wafer acceptance test to examine defects on joint nodes between transistors on a wafer. Therefore, a plurality of wafer acceptance test coefficients $WAT_S$ belonging to the electric/layout domain is determined.

The plurality of wafer acceptance test coefficients $WAT_S$ is then transformed into a plurality of metrology coefficients $MET_S$ belonging to the metrology/defect domain, according to the fact that the systematic wafer acceptance test integral $\lambda_{S,WAT}$ indicates an integral of the plurality of wafer acceptance test coefficients $WAT_S$ and the plurality of metrology coefficients $MET_S$.

Last, the plurality of metrology coefficients $MET_S$ is transformed into a of systematic fault detection and classification coefficients $FDC_{S1}$, where the first plurality of fault detection and classification coefficients $FDC_{S1}$ are to indicate the prediction result of causes of wafer defects. Note that the first plurality of systematic fault detection and classification coefficients $FDC_{S1}$ belongs to the machine sensor domain.

(c-2) Systematic Defect Density Integral $\lambda_{S,DD}$

The systematic defect density integral $\lambda_{S,DD}$ is processed to determine a plurality of systematic critical area coefficients $CA_S$ belonging to the electric/layout domain.

The plurality of systematic critical area coefficients $CA_S$ is then transformed into a plurality of systematic defect density coefficients $DD_S$ belonging to the metrology/defect domain, according to the fact that the systematic defect density integral $\lambda_{S,DD}$ indicates an integral of the plurality of systematic critical area coefficients $CA_S$ and the plurality of systematic defect density coefficients $DD_S$.

Similarly, the plurality of systematic defect density coefficients $DD_S$ is transformed into a second plurality of systematic fault detection and classification coefficients $FDC_{S2}$.

Note that the second plurality of systematic fault detection and classification coefficients $FDC_{S2}$ belongs to the machine sensor domain.

(c-3) Random Defect Density Integral $\lambda_{R,DD}$

The random defect density integral $\lambda_{R,DD}$ is processed to determine a plurality of random critical area coefficients $CA_R$ belonging to the electric/layout domain.

The plurality of random critical area coefficients $CA_R$ is then transformed into a plurality of random defect density coefficients $DD_R$ belonging to the metrology/defect domain, according to the fact that the random defect density integral $\lambda_{R,DD}$ indicates an integral of the plurality of random critical area coefficients $CA_R$ and the plurality of random defect density coefficients $DD_R$.

Similarly, the plurality of random defect density coefficients $DD_R$ is transformed into a plurality of random fault detection and classification coefficients $FDC_R$. Note that the plurality of random fault detection and classification coefficients $FDC_R$ belongs to the machine sensor domain.

After retrieving the plurality of first and second systematic fault detection and classification coefficients $FDC_{S1}$, $FDC_{S2}$ and the plurality of random fault detection and classification coefficients $FDC_R$, a profile of yield prediction of wafers can be fulfilled, so as to improve the yield of wafer fabrication.

The hierarchical wafer yield prediction method shown in FIG. 1 uses a top-down approach of prediction.

A permutation of the hierarchical yield prediction method according to an embodiment of the present invention may be used for predicting lifetimes of transistors on a wafer or a wafer. Please refer to FIG. 2, which illustrates a hierarchy utilized in a hierarchical wafer lifetime prediction method according to a second embodiment of the present invention.

(d) Lifetime Domain

In the case of a wafer lifetime prediction, an overall die lifetime $LT_T$ of fabricated wafer is in place of the overall die yield $Y_T$. The overall die lifetime $LT_T$ is to be measured first. The overall die lifetime of a wafer is represented by following equation:

$$LT_T = LT_{ED} LT_{ID} \qquad (5);$$

where $LT_{ID}$ is an intrinsic lifetime $LT_{ID}$, $LT_{ED}$ is an extrinsic lifetime $LT_{ED}$ and $LT_T$ is the overall die lifetime $LT_T$ of a wafer.

When a number of wafers to be analyzed is greater than one, the intrinsic lifetime $LT_{ID}$ is determined by dividing the overall die lifetime $LT_T$ by the extrinsic lifetime $LT_{ED}$. To determine the extrinsic lifetime $LT_{ED}$, the distance between a peak of the histogram and a maximum die lifetime identified on a wafer map is determined. It is expected to be approximately three standard deviation ($3\sigma$) of a normal distribution resulting from the extrinsic lifetime $LT_{ED}$. For a binomial model with extrinsic lifetime $LT_{ED}$ as a mean, the standard deviation ($\sigma$) of the extrinsic lifetime $LT_{ED}$ is given by $\sqrt{LT_{ED}(1-LT_{ED})/GD}$. The extrinsic lifetime $LT_{ED}$ is determined according to the following equation:

$$ML - LT_{ED} = 3\sqrt{LT_{ED}(1-LT_{ED})/GD} \qquad (6);$$

where ML denotes an achieved maximum die lifetime and GD denotes a total number of die printed on the wafer, i.e., the gross die. Equation (6) is used to find the extrinsic lifetime $LT_{ED}$.

When only one wafer is to be analyzed, the extrinsic lifetime $LT_{ED}$ is then determined by dividing the overall die lifetime $LT_T$ by the intrinsic lifetime $LT_{ID}$. Linear regression is performed to determine the best fit value for the intrinsic lifetime $LT_{ID}$ according to the overall die lifetime $LT_T$, an overall defect density $D_O$ and a die area A. Data points for linear regression are determined by having a scalar dependent variable being the overall die lifetime $LT_T$ and an explanatory variable being the die area A multiplied by the number of dice grouped together, i.e., groups of 2, 3, 4, 5, etc. The linear regression equation is as follows:

$$\ln LT_{ED} = \ln LT_{ID} - AD_O \qquad (7);$$

Figure 2:
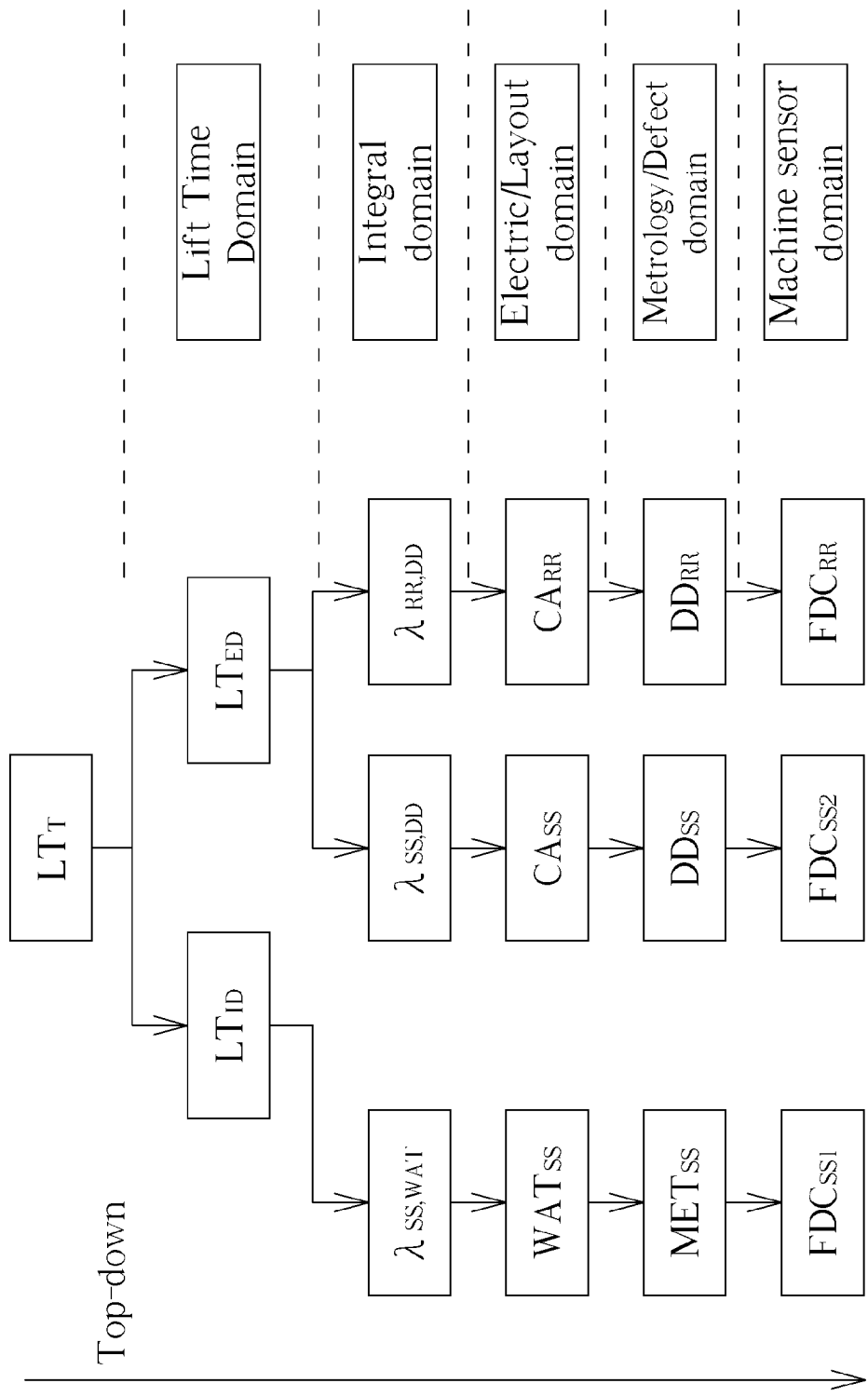
FIG. 2 illustrates a hierarchy utilized in a hierarchical wafer lifetime prediction method.
Figure 3:
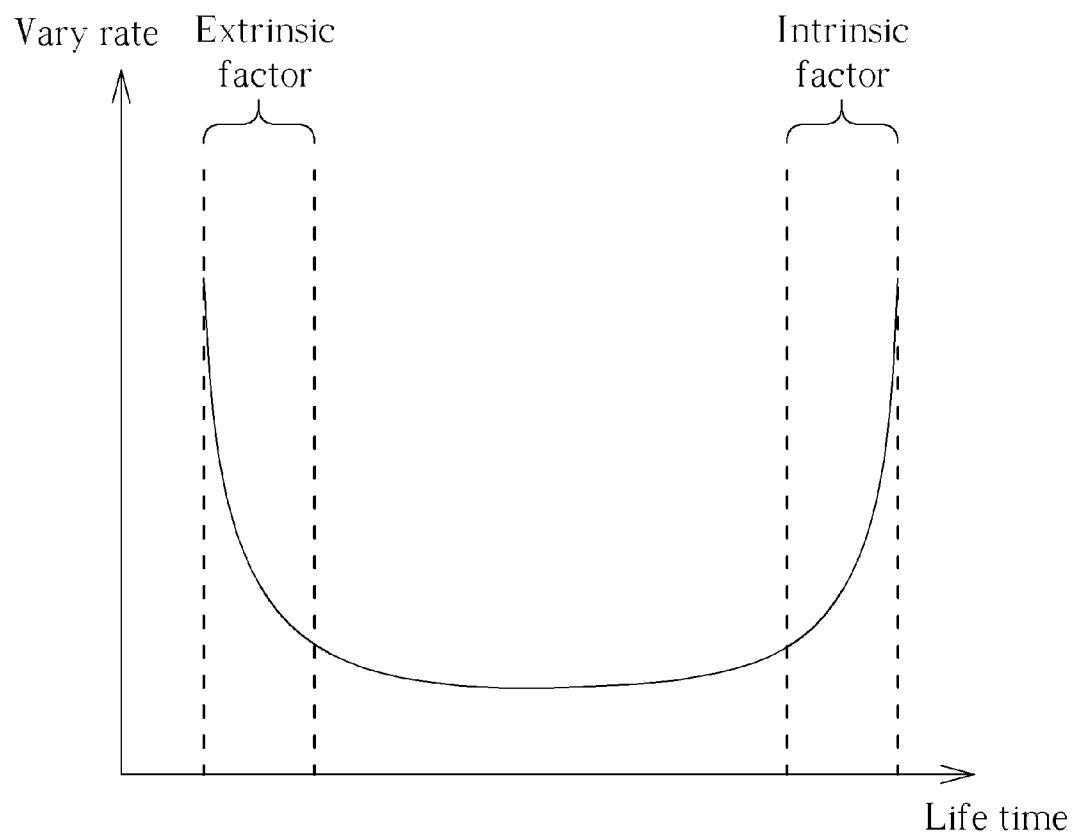
FIG. 3 illustrates a relation function between a lifetime of a wafer and a vary rate of the wafer.

The intrinsic lifetime $LT_{ID}$ and the extrinsic lifetime $LT_{ED}$ are assumed to belong to a lifetime domain, as shown in FIG. 2. Please refer to FIG. 3, which illustrates a relation function between the wafer lifetime and a vary rate of the wafer. FIG. 3 is utilized for indicating an intrinsic factor and an extrinsic factor of the wafer lifetime, where the relation function forms a normal distribution, the intrinsic factor corresponds to longer lifetimes of the wafer, and the extrinsic factor corresponds to shorter lifetimes of the wafer.

(e) Integral Domain

A systematic wafer acceptance test integral $\lambda_{SS,WAT}$, a systematic defect density integral $\lambda_{SS,DD}$ and a random defect density integral $\lambda_{RR,DD}$ are mean number of defects per die according to the respective wafer lifetime.

The systematic wafer acceptance test integral $\lambda_{SS,WAT}$ can be calculated by integrating the intrinsic lifetime $LT_{ID}$ throughout the wafer. The systematic defect density integral $\lambda_{S,DD}$ and the random defect density integral $\lambda_{R,DD}$ can be calculated by integrating the extrinsic lifetime $LT_{ED}$ throughout the wafer.

The systematic wafer acceptance test integral $\lambda_{SS,WAT}$, the systematic defect density integral $\lambda_{SS,DD}$, and the random defect density integral $\lambda_{RR,DD}$ belong to an integral domain, as shown in FIG. 2.

(f) Electric/Layout Domain, Metrology/Defect Domain, and Machine Sensor Domain

The electric/layout domain, the metrology/defect domain, and the machine sensor domain are performed under the principal component analysis or the partial least square analysis.

Note that plurality of data from the electric/layout domain uses the plurality of data from the integral domain, the metrology/defect domain uses the plurality of data from the electric/layout domain, and the machine sensor domain uses the plurality of data from the metrology/defect domain to perform data analysis under specified domain.

(f-1) Systematic Wafer Acceptance Test Integral $\lambda_{SS,WAT}$

The systematic wafer acceptance test integral $\lambda_{SS,WAT}$ is processed by the wafer acceptance test. Therefore, a plurality of wafer acceptance test coefficients $WAT_{SS}$ belonging to the electric/layout domain can be determined.

The plurality of wafer acceptance test coefficients $WAT_{SS}$ is then transformed into a plurality of metrology coefficients $MET_{SS}$ belonging to the metrology/defect domain, according to the fact that the systematic wafer acceptance test integral $\lambda_{SS,WAT}$ indicates an integral of the plurality of wafer acceptance test coefficients $WAT_{SS}$ and the plurality of metrology coefficients $MET_{SS}$.

Last, the plurality of metrology coefficients $MET_{SS}$ is transformed into a first plurality of systematic fault detection and classification coefficients $FDC_{SS1}$. Note that the first plurality of systematic fault detection and classification coefficients $FDC_{SS1}$ belongs to the machine sensor domain.

(f-2) Systematic defect density integral $\lambda_{SS,DD}$

The systematic defect density integral $\lambda_{SS,DD}$ is processed to determine a plurality of systematic critical area coefficients $CA_{SS}$ belonging to the electric/layout domain.

The plurality of systematic critical area coefficients $CA_{SS}$ is then transformed into a plurality of systematic density defect coefficients $DD_{SS}$ belonging to the metrology/defect domain, according to the fact that the systematic defect density integral $\lambda_{SS,DD}$ indicates an integral of the plurality of systematic critical area coefficients $CA_{SS}$ and the plurality of systematic defect density coefficients $DD_{SS}$.

Similarly, the plurality of systematic defect density coefficients $\lambda_{SS,DD}$ is transformed into a second plurality of systematic fault detection and classification coefficients $FDC_{SS2}$. Note that the second plurality of systematic fault detection and classification coefficients $FDC_{SS2}$ belongs to the machine sensor domain.

(f-3) Random Defect Density Integral $\lambda_{RR,DD}$

The random defect density integral $\lambda_{RR,DD}$ is performed to determine a plurality of random critical area coefficients $CA_{RR}$ belonging to the electric/layout domain.

The plurality of random critical area coefficients $CA_{RR}$ is then transformed into a plurality of random defect density coefficients $DD_{RR}$ belonging to the metrology/defect domain, according to the fact that the random defect density integral $\lambda_{RR,DD}$ indicates an integral of the plurality of random critical area coefficients $CA_{RR}$ and the plurality of random defect density coefficients $DD_{RR}$.

The plurality of random defect density coefficients $DD_{RR}$ is transformed into a plurality of random fault detection and classification coefficients $FDC_{RR}$. Note that the plurality of random fault detection and classification coefficients $FDC_{RR}$ belongs to the machine sensor domain.

After retrieving the plurality of first and second systematic fault detection and classification coefficients $FDC_{SS1}$, $FDC_{SS2}$ and the plurality of random fault detection and classification coefficients $FDC_{RR}$, a profile of lifetime prediction of wafers can be fulfilled for improving the wafer fabrication.

Similar with the wafer yield prediction, the hierarchical wafer lifetime prediction method shown in FIG. 2 uses a top-down approach of prediction.

Figure 4:
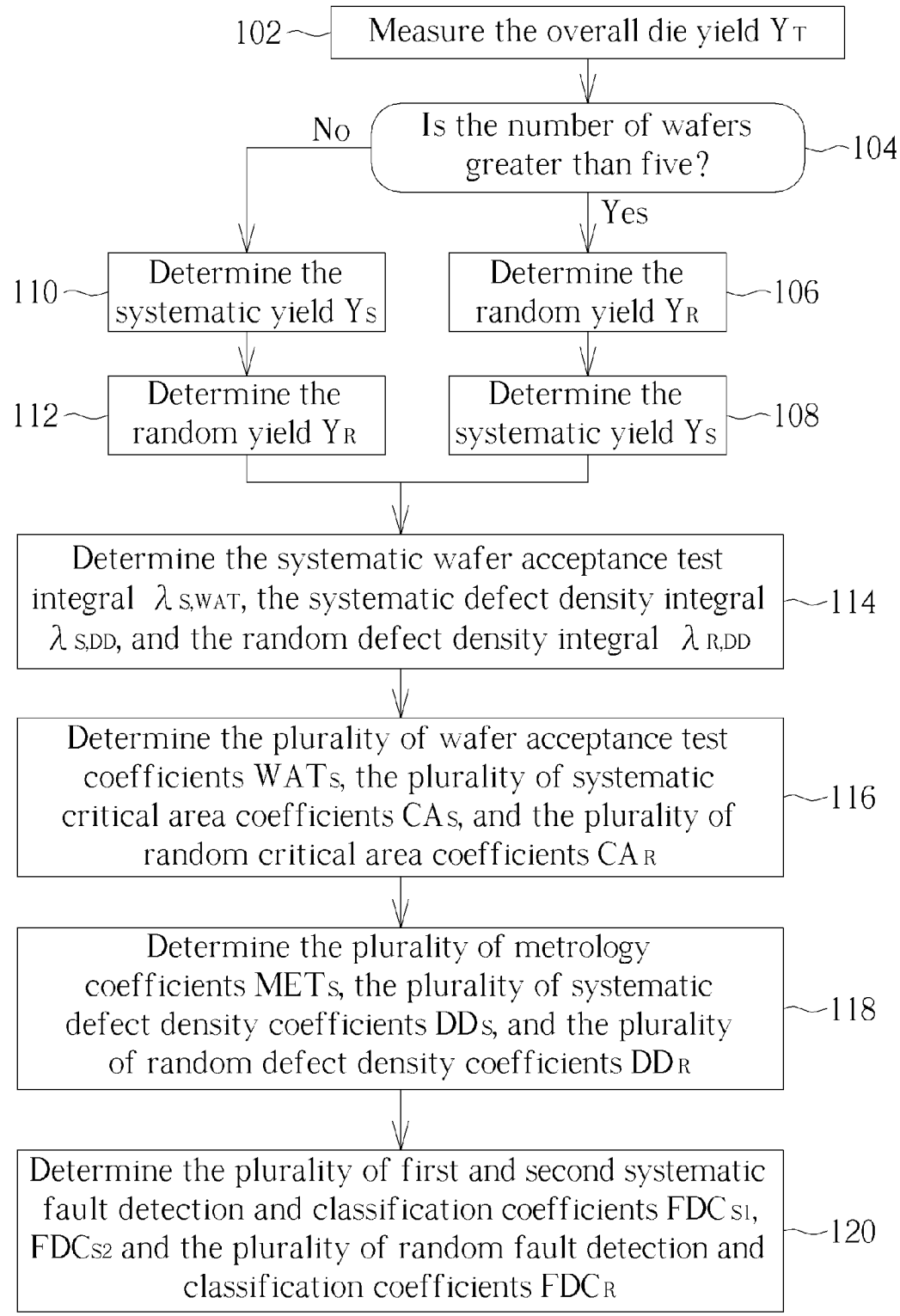
FIG. 4 illustrates a flowchart of the hierarchical wafer yield prediction method of the present invention.

Please refer to FIG. 4, which illustrates a flowchart of the hierarchical wafer yield prediction method according to the first embodiment of the present invention.

Step 102: Measure the overall die yield $Y_T$;
Step 104: Is the number of wafers is greater than five? If yes, go to step 106; if no, go to step 110;
Step 106: Determine the random yield $Y_R$;
Step 108: Determine the systematic yield $Y_S$ by dividing the overall die yield $Y_T$ by the random yield $Y_R$; go to step 114;
Step 110: Determine the systematic yield $Y_S$;
Step 112: Determine the random yield $Y_R$ by dividing the overall die yield $Y_T$ by the systematic yield $Y_S$;
Step 114: Determine the systematic wafer acceptance test integral $\lambda_{S,WAT}$, the systematic defect density integral $\lambda_{S,DD}$, and the random defect density integral $\lambda_{R,DD}$;
Step 116: Determine the plurality of wafer acceptance test coefficients $WAT_S$, the plurality of systematic critical area coefficients $CA_S$, and the plurality of random critical area coefficients $CA_R$;
Step 118: Determine the plurality of metrology coefficients $MET_S$, the plurality of systematic defect density coefficients $DD_S$, and the plurality of random defect density coefficients $DD_R$;
Step 120: Determine the plurality of first and second systematic fault detection and classification coefficients $FDC_{S1}$, $FDC_{S2}$ and the plurality of random fault detection and classification coefficients $FDC_R$.

Figure 5:
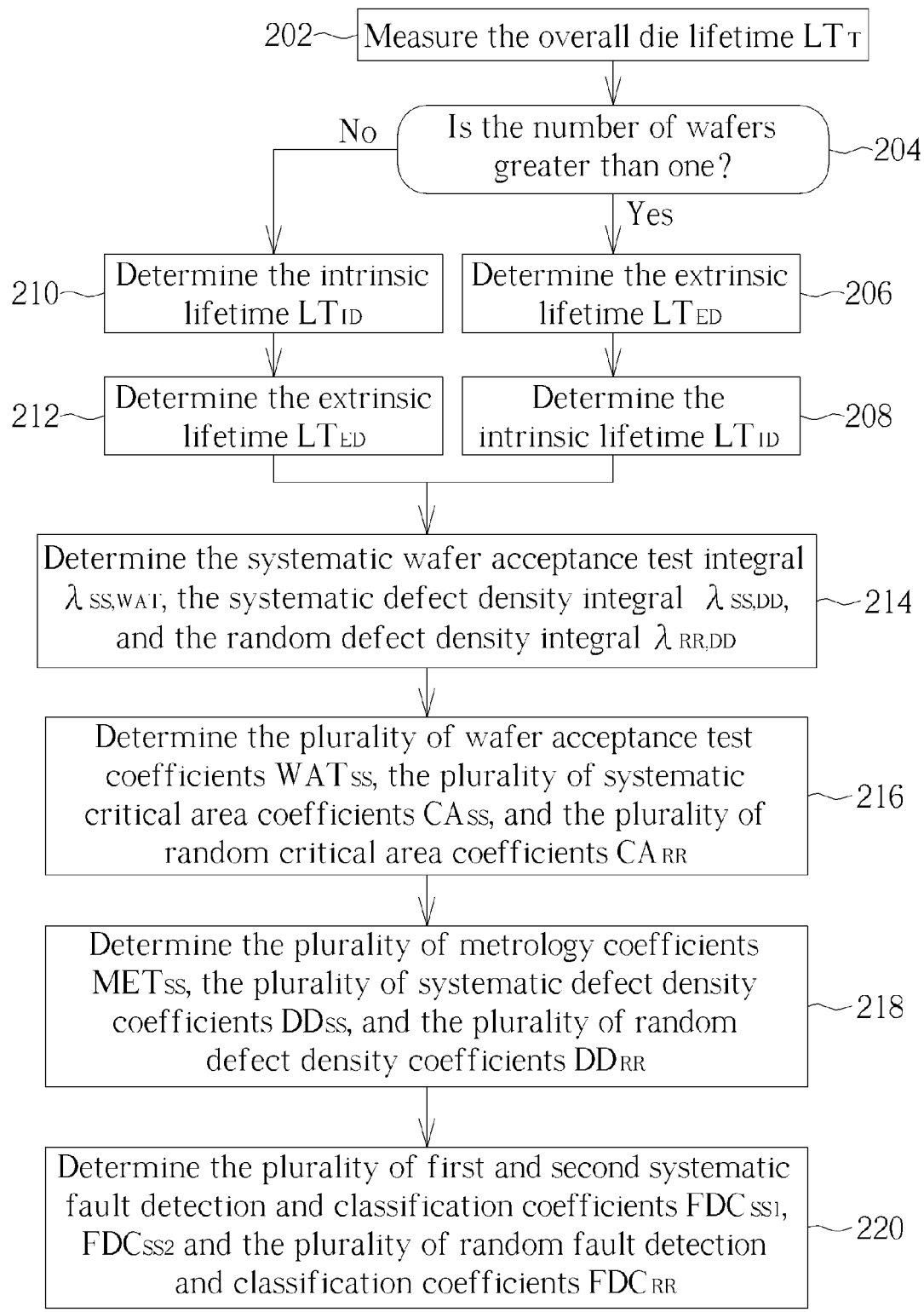
FIG. 5 illustrates a flowchart of the hierarchical wafer lifetime prediction method of the present invention.

Please also refer to FIG. 5, which illustrates a flowchart of the hierarchical wafer lifetime prediction method according to the second embodiment of the present invention.

Step 202: Measure the overall die lifetime $LT_T$;
Step 204: Is the number of wafers is greater than one? If yes, go to step 206; if no, go to step 210;

Step 206: Determine the extrinsic lifetime $LT_{ED}$;
Step 208: Determine the intrinsic lifetime $LT_{ID}$ by dividing the overall die lifetime $LT_T$ by the extrinsic lifetime $LT_{ED}$; go to step 214;
Step 210: Determine the intrinsic lifetime $LT_{ID}$;
Step 212: Determine the extrinsic lifetime $LT_{ED}$ by dividing the overall die lifetime $LT_T$ by the intrinsic lifetime $LT_{ID}$;
Step 214: Determine the systematic wafer acceptance test integral $\lambda_{SS,WAT}$, the systematic defect density integral $\lambda_{SS,DD}$, and the random defect density integral $\lambda_{RR,DD}$;
Step 216: Determine the plurality of wafer acceptance test coefficients $WAT_{SS}$, the plurality of systematic critical area coefficients $CA_{SS}$, and the plurality of random critical area coefficients $CA_{RR}$;
Step 218: Determine the plurality of metrology coefficients $MET_{SS}$, the plurality of systematic defect density coefficients $DD_{SS}$, and the plurality of random defect density coefficients $DD_{RR}$;
Step 220: Determine the plurality of first and second systematic fault detection and classification coefficients $FDC_{SS1}$, $FDC_{SS2}$ and the plurality of random fault detection and classification coefficients $FDC_{RR}$.

FIGS. 4-5 indicate a summary of performing the hierarchies shown in FIGS. 1-2 for prediction the yield or the lifetime of wafers. However, embodiments formed by reasonable combinations and/or permutations of the flowcharts shown in FIG. 4 or FIG. 5, or by adding the above-mentioned limitations, should also be regarded as embodiments of the present invention. Also noting that the number of wafers used in the decision step in step 104 and step 204 may vary according to the preference of the user.

The present invention discloses a hierarchical wafer yield prediction method and a hierarchical wafer lifetime prediction method for discarding noises during prediction. In both the methods, coefficients of a yield domain for wafer yield prediction and a lifetime domain for a wafer lifetime prediction, an integral domain, an electric/layout domain, a metrology/defect domain, and a machine sensor domain are determined in a hierarchical manner. With the aid of the hierarchically-determined coefficients, noises in prediction can be reduced so that precision of prediction results of the yields or the lifetimes of wafers can be raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of a wafer fabrication process comprising:
performing the wafer fabrication process;
measuring an overall die yield of a plurality of wafers from the wafer fabrication process;
updating a profile of a yield prediction according to the overall die yield,
updating the profile of the yield prediction comprises:
a processor determining a random yield and a systematic yield according to the overall die yield;
the processor determining a systematic wafer acceptance test integral value and a systematic defect density integral value according to the systematic yield;
the processor determining a wafer acceptance test coefficient according to the systematic wafer acceptance test integral value;
the processor determining a metrology coefficient according to the wafer acceptance test coefficient;

the processor determining a first systematic fault detection and classification value according to the metrology coefficient;

the processor determining a second systematic fault detection and classification value according to the systematic defect density integral value;

the processor determining a random defect density integral value according to the random yield;

the processor determining a random fault detection and classification value according to the random defect density integral value; and the processor generating an updated profile of the yield prediction according to the first systematic fault detection and classification value, the second systematic fault detection and classification value, and the random fault detection and classification value; and determining a yield of a subsequent wafer fabrication process using the updated profile of the yield prediction.

2. The method of claim 1, wherein the processor determining the random yield and the systematic yield according to the overall die yield comprises:

the processor determining the random yield according to a maximum die yield of a wafer and a total number of dies fabricated on the wafer; and the processor generating the systematic yield by dividing the overall die yield by the random yield.

3. The method of claim 2 wherein the processor determining the random yield according to the maximum yield of the wafer and the total number of dies fabricated on the wafer is the processor determining the random yield according to a following formula:

$$MY-Y_R=3\sqrt{Y_R(1-Y_R)/GD};$$

where MY is the maximum yield of the wafer, $Y_R$ is the random yield and GD is the total number of dies fabricated on the wafer.

4. The method of claim 1, wherein the processor determining the random yield and the systematic yield according to the overall die yield comprises:

the processor determining the systematic yield according to the overall die yield of the plurality of wafers, an overall defect density of the plurality of wafers and a die area; and the processor generating the random yield by dividing the overall die yield by the systematic yield.

5. The method of claim 4 wherein the processor determining the systematic yield according the overall die yield of the plurality of wafers, the overall defect density of the plurality of wafers and the die area is the processor determining the systematic yield according to a following formula:

$$\ln Y_T=\ln Y_S-AD_O;$$

where $Y_T$ is the overall die yield of the plurality of wafers, $Y_S$ is the systematic yield, $D_O$ is the overall defect density of the plurality of wafers and A is the die area.

6. The method of claim 1 wherein the processor determining the at least one systematic fault detection and classification value according to the at least one systematic integral value is the processor determining the at least one systematic fault detection and classification value according to the at least one systematic integral value by using a principal component analysis for identifying similarities and differences in a data set by generating a new data set and a partial least square analysis to build a linear model for determining correlations between causes of wafer defects.

7. The method of claim 6 wherein the principal component analysis comprises:

getting the data set;

subtracting a mean from each of a data dimension of the data set to generate deviations;

calculating a covariance matrix according to the deviations;

calculating eigenvectors and eigenvalues of the covariance matrix;

choosing components of the eigenvectors and forming a feature vector; and deriving the new data set according to the feature vector;

and the partial least square analysis comprises:

building the linear model according to an equation:

$$Y=XB+E$$

where Y is an n cases by m variables response matrix, X is an n cases by p variables predictor matrix, B is a p by m regression coefficient matrix, and E is a noise term for the model which has the same dimensions as Y.

8. The method of claim 1 wherein the processor determining the second systematic fault detection and classification value according to the systematic defect density integral value comprises:

the processor determining a systematic critical area coefficient according to the systematic defect density integral value;

the processor determining a systematic defect density coefficient according to the systematic critical area coefficient; and the processor determining the second systematic fault detection and classification value according to the systematic defect density coefficient.

9. The method of claim 1 wherein the processor determining the random fault detection and classification value according to the random defect density integral value is the processor determining the random fault detection and classification value according to the random defect density integral value by using a principal component analysis for identifying similarities and differences in a data set by generating a new data set and a partial least square analysis to build a linear model for determining correlations between causes of wafer defects.

10. The method of claim 9 wherein the principal component analysis comprises:

getting the data set;

subtracting a mean from each of a data dimension of the data set to generate deviations;

calculating a covariance matrix according to the deviations;

calculating eigenvectors and eigenvalues of the covariance matrix;

choosing components of the eigenvectors and forming a feature vector; and deriving the new data set according to the feature vector;

and the partial least square analysis comprises:

building the linear model according to an equation:

$$Y=XB+E$$

where Y is an n cases by m variables response matrix, X is an n cases by p variables predictor matrix, B is a p by m regression coefficient matrix, and E is a noise term for the model which has the same dimensions as Y.

11. The method of claim 1 wherein the processor determining the random fault detection and classification value according to the random defect density integral value comprises:

the processor determining a random critical area coefficient according to the random defect density integral value;

the processor determining a random defect density coefficient according to the random critical area coefficient; and the processor determining the random fault detection and classification value according to the random defect density coefficient.

* * * * *